US012757792B2

(12) United States Patent
Carroll et al.

(10) Patent No.: US 12,757,792 B2
(45) Date of Patent: Oct. 6, 2026

(54) WAFER-LEVEL HYBRID BONDED RF SWITCH WITH REDISTRIBUTION LAYER

(71) Applicant: Qorvo US, Inc., Greensboro, NC (US)

(72) Inventors: Michael Carroll, Jamestown, NC (US); Eric K. Bolton, Kernersville, NC (US); Ma Shirley Asoy, High Point, NC (US); Xi Luo, High Point, NC (US); Daniel Charles Kerr, Oak Ridge, NC (US); Chi-Hsien Chiu, High Point, NC (US)

(73) Assignee: Qorvo US, Inc., Greensboro, NC (US)

( * ) Notice: Subject to any disclaimer, the term of this patent is extended or adjusted under 35 U.S.C. 154(b) by 439 days.

(21) Appl. No.: 18/384,029

(22) Filed: Oct. 26, 2023

(65) Prior Publication Data

US 2024/0153893 A1 May 9, 2024

Related U.S. Application Data

(60) Provisional application No. 63/451,954, filed on Mar. 14, 2023, provisional application No. 63/422,031, filed on Nov. 3, 2022.

(51) Int. Cl.
*H10W 10/17* (2026.01)
*H10W 90/00* (2026.01)
(Continued)

(52) U.S. Cl.
CPC ............ *H10W 90/00* (2026.01); *H10W 70/05* (2026.01); *H10W 70/65* (2026.01);
(Continued)

(58) Field of Classification Search
CPC ..... H10W 90/00; H10W 70/05; H10W 70/65; H10W 70/652; H10W 70/66;
(Continued)

(56) References Cited

U.S. PATENT DOCUMENTS 7,911,044 B2 3/2011 Yang et al.
8,637,983 B2 1/2014 Martinez et al.
(Continued)

OTHER PUBLICATIONS

Extended European Search Report for European Patent Application No. 23207097.9, mailed Mar. 11, 2024, 13 pages.

*Primary Examiner* — Theresa T Doan
(74) *Attorney, Agent, or Firm* — Withrow & Terranova, P.L.L.C.

(57) ABSTRACT

Embodiments of an IC device are disclosed. In some embodiments, an integrated circuit (IC) device, includes: an first active semiconductor layer that includes first active semiconductor device regions; a second active semiconductor layer that includes active semiconductor regions, the second active semiconductor layer being connected to the first active semiconductor layer and being positioned over the first active semiconductor layer; a first redistribution layer positioned over the second active conductor layer, the first redistribution layer is electrically connected to the first active semiconductor layer and the second active semiconductor layer; a passivation layer positioned on the first redistribution layer; a second redistribution layer positioned over the passivation layer, wherein the second redistribution layer is electrically connected to the first redistribution layer.

17 Claims, 10 Drawing Sheets

(51) Int. Cl.

| | |
|---|---|
| *H10W 70/05* | (2026.01) |
| *H10W 70/65* | (2026.01) |
| *H10W 70/652* | (2026.01) |
| *H10W 70/66* | (2026.01) |
| *H10W 72/20* | (2026.01) |
| *H10W 72/29* | (2026.01) |
| *H10W 72/90* | (2026.01) |

(52) U.S. Cl.
CPC .......... *H10W 70/652* (2026.01); *H10W 70/66* (2026.01); *H10W 72/242* (2026.01); *H10W 72/29* (2026.01); *H10W 72/90* (2026.01); *H10W 72/922* (2026.01); *H10W 72/9223* (2026.01); *H10W 72/923* (2026.01); *H10W 72/926* (2026.01); *H10W 72/942* (2026.01); *H10W 72/944* (2026.01); *H10W 72/952* (2026.01); *H10W 90/792* (2026.01)

(58) Field of Classification Search
CPC ... H10W 72/242; H10W 72/29; H10W 72/90; H10W 72/922; H10W 72/9223; H10W 72/923; H10W 72/926; H10W 72/942; H10W 72/944; H10W 72/952; H10W 90/792; H10W 20/2134; H10W 20/218; H10W 20/481; H10W 72/01; H10W 44/20; H10W 80/312; H10W 80/327; H10W 20/40; H10W 20/47; H10W 20/20; H10W 74/137; H10W 74/147
USPC .......................................................... 257/213
See application file for complete search history.

(56) References Cited

U.S. PATENT DOCUMENTS

| | | | | |
|---|---|---|---|---|
| 11,114,433 | B2 | 9/2021 | Chen et al. | |
| 2016/0049384 | A1 | 2/2016 | Lu et al. | |
| 2019/0148351 | A1 | 5/2019 | Chen et al. | |
| 2019/0252375 | A1 | 8/2019 | Delacruz et al. | |
| 2021/0057309 | A1* | 2/2021 | Hu ........................ | H10W 20/20 |
| 2021/0074681 | A1 | 3/2021 | Chen et al. | |
| 2022/0375918 | A1 | 11/2022 | Chiu | |
| 2024/0234401 | A9* | 7/2024 | Liu .......................... | H10D 1/68 |

* cited by examiner

WAFER-LEVEL HYBRID BONDED RF SWITCH WITH REDISTRIBUTION LAYER

RELATED APPLICATIONS

This application claims the benefit of provisional patent application Ser. No. 63/451,954, filed Mar. 14, 2023, and provisional patent application Ser. No. 63/422,031, filed Nov. 3, 2022, the disclosures of which are hereby incorporated herein by reference in its entirety.

FIELD OF THE DISCLOSURE

This disclosure relates generally to integrated circuit (IC) devices and methods of manufacturing the same.

BACKGROUND

Stacking different integrated circuit (IC) structures on top of one another allows for more semiconductor components to be provided within a particular footprint. However, as die sizes have become more and more compact the parasitics caused by more components being cramped in a smaller device effects the performance of the IC circuits. For example, solder bumps are now being moved directly over active semiconductor areas and the parasitic capacitance resulting from the solder bump can affect the performance of the IC circuits. Thus, isolation techniques are needed to lower the parasitics of more components being provided over the same area.

SUMMARY

In some embodiments, an integrated circuit (IC) device, includes: an first active semiconductor layer that includes first active semiconductor device regions; a first back end of line (BEOL) positioned on the first active semiconductor layer; a first conductive structure is integrated into the first BEOL and connects to at least one of the first active semiconductor components; a second active semiconductor layer that includes second active semiconductor components; a second BEOL positioned on the second active semiconductor layer, wherein a second conductive structure is integrated into the second BEOL and connects to at least one of the second active semiconductor components, wherein the second conductive structure is electrically connected to the first conductive structure; a first redistribution layer positioned over the second active conductor layer, the first redistribution layer is electrically connected to the second conductive structure; a passivation layer positioned on the first redistribution layer; a second redistribution layer positioned over the passivation layer, wherein the second redistribution layer is electrically connected to the first redistribution layer. In some embodiments, the IC device further includes a hybrid bonding layer with a third conductive structure integrated into the hybrid bonding layer, wherein: the first BEOL is positioned under the hybrid bonding layer; the second BEOL is positioned on the hybrid bonding layer; the third conductive structure electrically connects the first conductive structure to the second conductive structure.

In some embodiments, the IC device further includes a first buried oxide layer, a trap rich layer, and a handle layer, the first active semiconductor layer is positioned on the first buried oxide layer, the first trap layer is positioned on the first buried box layer, and the first handle layer is positioned on the first trap layer. In some embodiments, a second handle layer is not provided in the second IC device. In some embodiments, the IC device further includes a second buried oxide layer and a silicon nitride layer, wherein: the passivation layer is a first passivation layer; the second active semiconductor layer is positioned on the second buried oxide layer; the silicon nitride layer is positioned on the second buried oxide layer. In some embodiments, the IC device further includes a second passivation layer and a third passivation layer, wherein: the second passivation layer is positioned on the silicon nitride layer; the third passivation layer is positioned on the second passivation layer; the first passivation layer is positioned on the third passivation layer. In some embodiments, the IC device further includes a conductive via that extends through the first passivation layer, the second passivation layer, and the third passivation layer so that the conductive via connects the second redistribution layer to the first redistribution layer. In some embodiments, the IC device further includes: a solder bump positioned on the second redistribution layer. In some embodiments, the solder bump is at least partially aligned over the first active semiconductor layer and the second active semiconductor layer. In some embodiments, the IC device further includes one or more first gate electrodes positioned over the first active semiconductor device regions such that the one or more first gate electrodes and the first active semiconductor device regions form one or more first field effect transistors (FETs). In some embodiments, the IC device further includes one or more second gate electrodes positioned over the second active semiconductor device regions such that the one or more second gate electrodes and the second active semiconductor device regions form one or more second FETs. In some embodiments, the one or more first FETS and the one or more second FETs are connected by the first conductive structure and the second conductive structure to provide a stack of FETs coupled in series. In some embodiments, the IC device further includes a conductive via that connects the first redistribution layer to the second conductive structure. In some embodiments, the first redistribution layer includes aluminum. In some embodiments, the second redistribution layer includes copper.

In some embodiments, an integrated circuit (IC) device, includes: an first active semiconductor layer that includes first active semiconductor device regions; a second active semiconductor layer that includes active semiconductor regions, the second active semiconductor layer being connected to the first active semiconductor layer and being positioned over the first active semiconductor layer; a first redistribution layer positioned over the second active conductor layer, the first redistribution layer is electrically connected to the first active semiconductor layer and the second active semiconductor layer; a passivation layer positioned on the first redistribution layer; a second redistribution layer positioned over the passivation layer, wherein the second redistribution layer is electrically connected to the first redistribution layer. In some embodiments, the IC device further includes a first back end of line (BEOL), a second BEOL, and a hybrid bonding layer wherein: the first BEOL is positioned under the hybrid bonding layer; the first BEOL is positioned on the first active semiconductor layer; the hybrid bonding layer is positioned between the first BEOL and the second BEOL; the second BEOL is positioned between the hybrid bonding layer and the second active semiconductor layer. In some embodiments, the first redistribution layer includes aluminum. In some embodiments, the second redistribution layer includes copper.

In some embodiments, a method of manufacturing an integrated circuit (IC), includes: providing an IC device that includes: an first active semiconductor layer that includes first active semiconductor device regions; a first back end of line (BEOL) positioned on the first active semiconductor layer; a first conductive structure is integrated into the first BEOL and connects to at least one of the first active semiconductor components; a second active semiconductor layer that includes second active semiconductor components; and a second BEOL positioned on the second active semiconductor layer, wherein a second conductive structure is integrated into the second BEOL and connects to at least one of the second active semiconductor components, wherein the second conductive structure is electrically connected to the first conductive structure; forming a first redistribution layer positioned over the second active semiconductor layer, the first redistribution layer is electrically connected to the second conductive structure; forming a passivation layer positioned on the first redistribution layer; forming a second redistribution layer positioned over the passivation layer, wherein the second redistribution layer is electrically connected to the first redistribution layer.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1A:
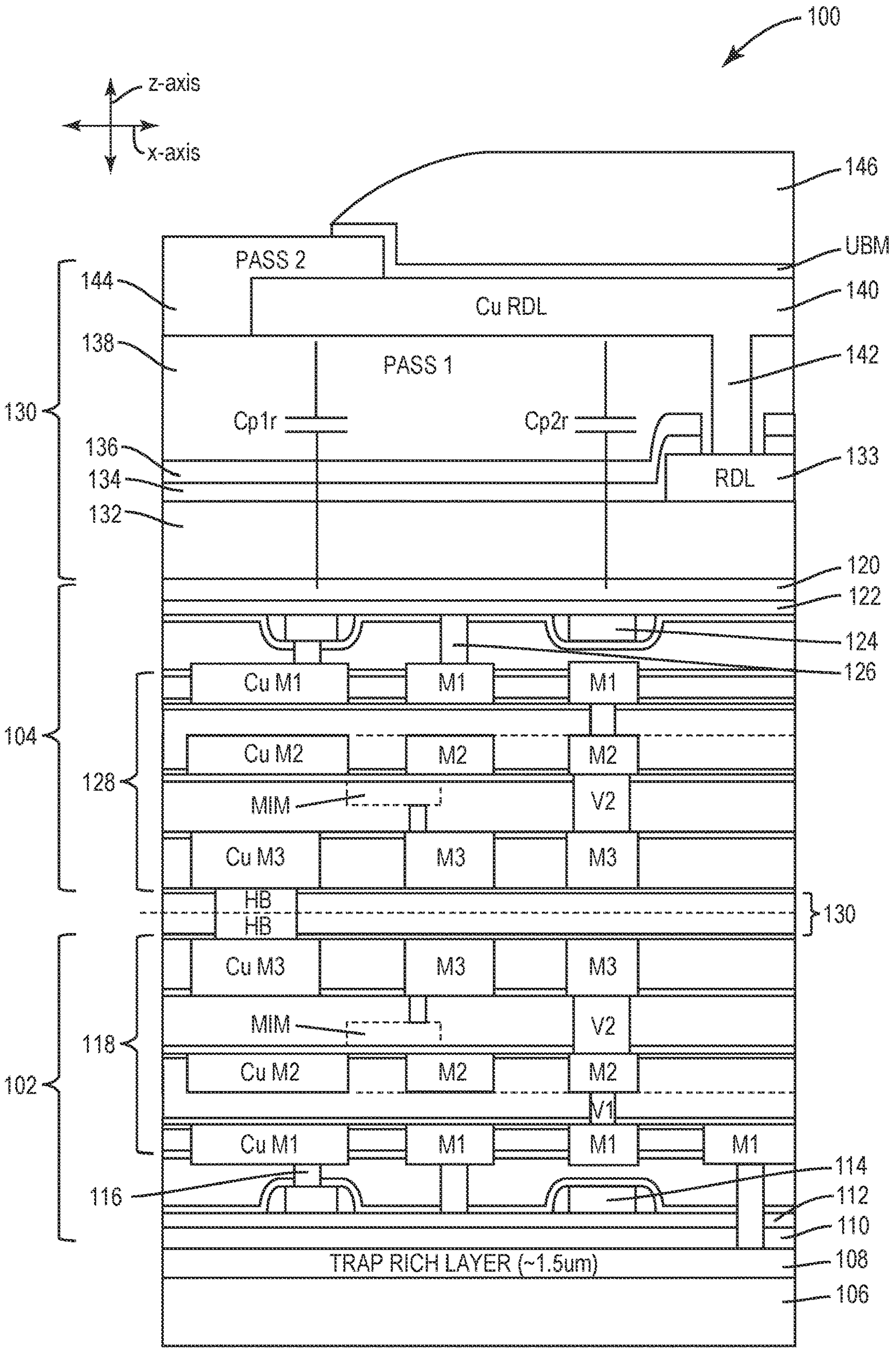
FIG. 1A is an integrated circuit (IC) device, in accordance with some embodiments.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term “and/or” includes any and all combinations of one or more of the associated listed items.

It will be understood that when an element such as a layer, region, or substrate is referred to as being “on” or extending “onto” another element, it can be directly on or extend directly onto the other element or intervening elements may also be present. In contrast, when an element is referred to as being “directly on” or extending “directly onto” another element, there are no intervening elements present. Likewise, it will be understood that when an element such as a layer, region, or substrate is referred to as being “over” or extending “over” another element, it can be directly over or extend directly over the other element or intervening elements may also be present. In contrast, when an element is referred to as being “directly over” or extending “directly over” another element, there are no intervening elements present. It will also be understood that when an element is referred to as being “connected” or “coupled” to another element, it can be directly connected or coupled to the other element or intervening elements may be present. In contrast, when an element is referred to as being “directly connected” or “directly coupled” to another element, there are no intervening elements present.

Relative terms such as “below” or “above” or “upper” or “lower” or “horizontal” or “vertical” may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms “a,” “an,” and “the” are intended to include the plural forms as well, unless the context clearly indicates otherwise. It will be further understood that the terms “comprises,” “comprising,” “includes,” and/or “including” when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

Embodiments of an integrated circuit (IC) device are disclosed. In some embodiments, the IC device includes two IC structures, where one IC structure is flipped on and over the other IC structure. Each IC structure includes a back end of line (BEOL) wherein a hybrid bonding layer connects a conductive structure in one BEOL with a conductive structure in the BEOL of the other IC structure. Each of the IC structures includes an active semiconductor layer wherein the active conductive layer of both of the IC structures has active semiconductor regions. A redistribution layer is provided over the IC structures and connects to the conductive structure of the BEOL of the top IC structure. A passivation layer is then provided over the redistribution layer. Another redistribution layer is provided over the passivation layer and is connected to the redistribution layer beneath the passivation layer. The passivation layer lowers the parasitic capacitance between a solder bump formed on the top redistribution layer and the top activation layer. This allows the circuit to operate appropriately while maintaining a more compact structure.

FIG. 1A is an integrated circuit (IC) device 100, in accordance with some embodiments.

FIG. 1A is a cross sectional view of the IC device 100. It should be noted that the cross-sectional view is not shown to scale but rather the scale is shown to help illustrate the different components of the IC device 100. In this embodiment, layers are stacked with reference to a z-axis. Gates for field effect transistors (FETs) extend with respect to a y-axis (not explicitly shown but is directed into and out of the page). The width of the FETs is shown with respect to an x-axis. The IC device 100 includes an IC structure 102 and an IC structure 104 stacked on top of one another. More specifically, the IC structure 104 is flipped over on the IC structure 102. From bottom to top with respect to the Z-axis shown in FIG. 1A, the IC structure 102 includes a front end of line (FEOL) that includes a handle semiconductor layer 106, a trap rich layer 108 positioned on the handle semiconductor layer 106, a buried oxide (BOX) layer 110 positioned on the trap rich layer 108, and an active semiconductor layer 112 positioned on the BOX layer 110. The active semiconductor layer 112 includes active semiconductor regions (e.g., source/drain regions) that form part of active semiconductor devices, such as FETs, diodes, etc. Active semiconductor regions are doped regions of the active semiconductor layer 112. The FEOL further includes gates 114 (not all labeled for the sake of brevity and clarity) formed over the active semiconductor layer 112. Connectors 116 are formed from conductive materials (e.g., metals) to connect the components of the active semiconductor layer 112 to a back end of line (BEOL) 118.

The IC structure 102 has the BEOL 118 positioned on the FEOL. The BEOL 118 includes various conductive layers (i.e., a metal layer M1, a metal layer M2, a metal layer M3 in FIG. 1A) and various interconnect layers (i.e., V1, V2 in FIG. 1A) that connect the conductive components formed by the various conductive layers. In other embodiments, the BEOL 118 can have more or less conductive layers and more or less interconnect layers than those shown in FIG. 1A. The conductive layers form conductive pads and conductive traces that are operable to interconnect the components in the active semiconductor layer 112. Conductive vias in the interconnect layers connect the conductive components in different conductive layers. Furthermore, passive components such as resistors, inductors, and/or capacitors are formed with the conductive layers and/or the interconnect layers. The conductive layers and conductive vias in the BEOL 118 form a conductive structure that is connected to the semiconductor regions in the FEOL that includes the active layer 112. Furthermore, passive components such as resistors, inductors, and/or capacitors are formed with the conductive layers and/or the interconnect layers. An insulating material is provided in each of the conductive layers (e.g., SiO, $SiO_2$) to isolate the BEOL 118 and provide structural integrity.

The IC structure 104 has been flipped onto and stacked over the IC structure 102. From top to bottom with respect to the Z-axis shown in FIG. 1A, the IC structure 104 includes a front end of line (FEOL) that a BOX layer 120 and an active semiconductor layer 122 positioned on the BOX layer 120. The active semiconductor layer 122 includes active semiconductor regions (e.g., source/drain regions) that form part of active semiconductor devices, such as FETs, diodes, etc. Active semiconductor regions are doped regions of the active semiconductor layer 122. Note that a trap rich layer and a handle layer is not included on the BOX layer 120 or the active semiconductor layer 122. This is because these layers were previously removed and are not part of the IC device 100. This reduces the thickness of the IC device with respect to the z-axis.

The FEOL further includes gates 124 (not all labeled for the sake of brevity and clarity) formed below the active semiconductor layer 122. Connectors 126 (e.g., VG and VD interconnect layers) are formed from conductive materials (e.g., metals) to connect the components of the active semiconductor layer 122 to a back end of line (BEOL) 128.

The IC structure 104 has a BEOL 128 positioned on the FEOL. The BEOL 128 includes various conductive layers (i.e., metal layer M1, metal layer M2, metal layer M3 in FIG. 1A) and various interconnect layers (i.e., V1, V2 in FIG. 1A) that connect the conductive components formed by the various conductive layers. In other embodiments, the BEOL 128 can have more or less conductive layers and more or less interconnect layers than those shown in FIG. 1A. The conductive layers form conductive pads and conductive traces that are operable to interconnect the components in the active semiconductor layer 122. Conductive vias in the interconnect layers connect the conductive components in different conductive layers. The conductive layers and conductive vias in the BEOL 128 form a conductive structure that is connected to the semiconductor regions in the FEOL that includes the active layer 122. Furthermore, passive components such as resistors, inductors, and/or capacitors are formed with the conductive layers and/or the interconnect layers. An insulating material is provided in each of the conductive layers (e.g., SiO, $SiO_2$) to isolate the BEOL 128 and provide structural integrity.

In FIG. 1A, the IC device 100 has a hybrid bonding layer 130 stacked between the BEOL 118 and the BEOL 128. The hybrid bonding layer 130 is formed from insulating materials and includes a conductive structure 129 that is integrated into the hybrid bonding layer 130. More specifically, the BEOL 118 is positioned directly under the hybrid bonding layer 130 with respect to the z-axis. The BEOL 128 is positioned on and over the hybrid bonding layer 130. The conductive structure 129 connects the conductive structure in the BEOL 118 to the conductive structure of the BEOL 128. In this embodiment, the conductive structure 129 is a metallic pillar that is connected to a conductive pad in the M3 layer of the BEOL 118 and a conductive pad in the M3 layer of the BEOL 128.

The IC device 100 includes an external connection structure 131 positioned on and over the FEOL of the IC structure 104. The external connection structure 131 is configured to allow for external electrical connections into and out of the IC device 100. The external connection structure 131 also provides adequate isolation of the IC structure 102 and the IC structure 104. From bottom to top with respect to the z-axis, a Silicon Nitride (SiN) layer 132 is positioned on the BOX layer 120. A redistribution layer (RDL) 133 is positioned on the SiN layer 132. The redistribution layer 133 is positioned on the SiN layer 132. Also, a passivation layer 134 is positioned on the SiN layer 132 and the redistribution layer 133. In some embodiments, the redistribution layer 133 is formed from aluminum (Al). In other embodiments, the SiN layer 132 is a silicon dioxide layer instead of a SiN layer 132. A passivation layer 136 is positioned on the passivation layer 134. A passivation layer 138 is positioned on the passivation layer 136. A redistribution layer 140 is positioned on the passivation layer 138. The redistribution layer 140 is formed from copper (Cu). A conductive via 142 extends from the redistribution layer 140 to the redistribution layer 133 and thereby electrically connects the redistribution layer 140 to the redistribution layer 133. The redistribution layer 133 is electrically connected to the conductive structure in the BEOL 128 (See FIG. 1B). A passivation layer 144 is positioned on the passivation layer 138. A solder bump 146 is positioned on the redistribution layer 140. The solder bump 146 is attached to the redistribution layer 140 with a UBM.

The passivation layer 138 is provided to reduce the parasitic capacitance between the solder bump 146 and the active semiconductor layer 122. Removing the trap rich layer and the handle layer from the active semiconductor layer 122 greatly reduces the thickness of the IC device 100. However, as IC devices have become more compact, the solder bump 146 partially or is fully aligned with the active semiconductor components in the active semiconductor layer 122. The passivation layer 138 provides the isolation between the solder bump 146 and the active semiconductor layer 122 so as to provide sufficiently low parasitic capacitance so as to meet corresponding performance specifications.

Figure 1B:
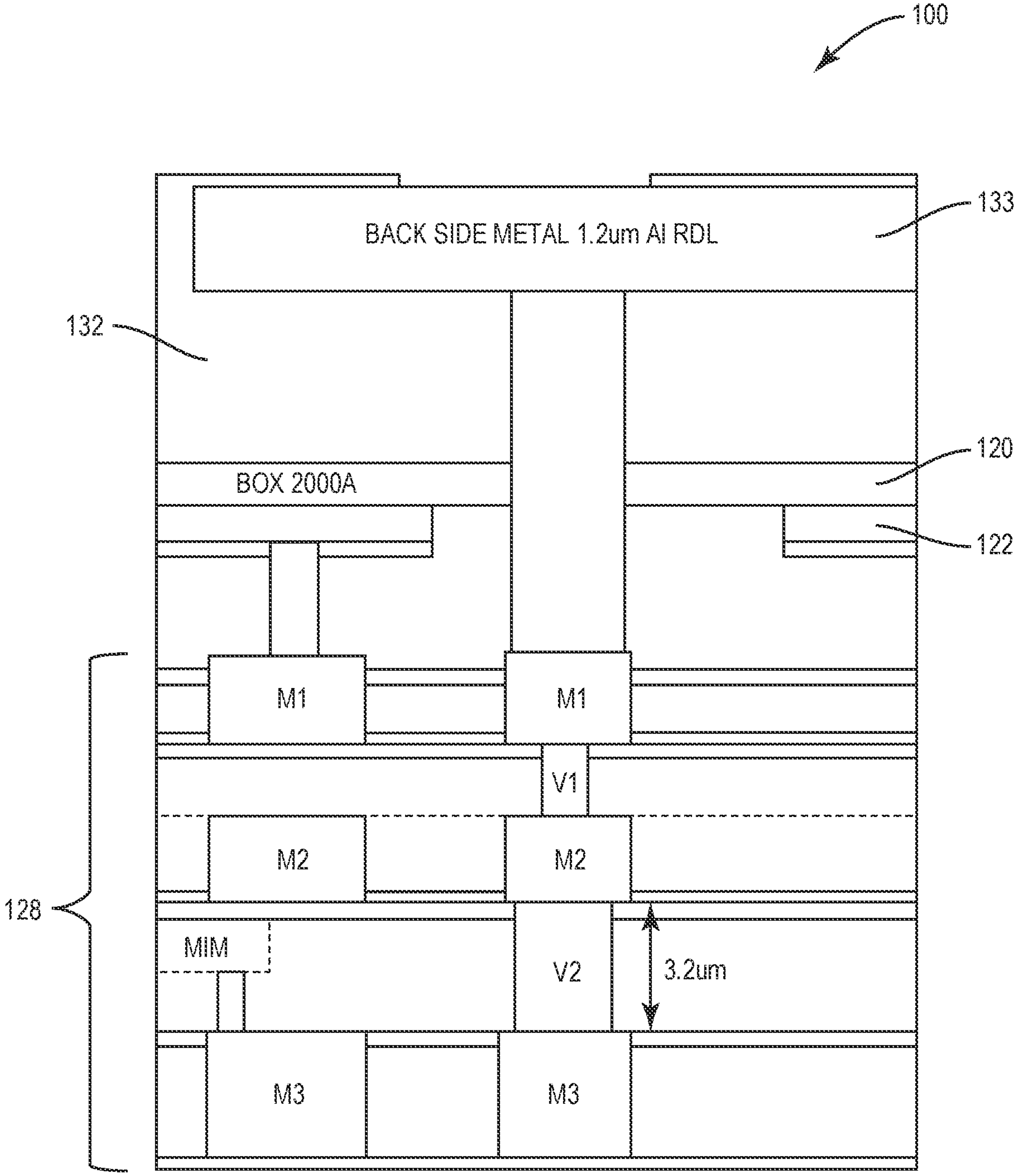
FIG. 1B is another view of the IC device in FIG. 1A, in accordance with some embodiments.

FIG. 1B is another view of the IC device 100, in accordance with some embodiments.

More specifically, FIG. 1B illustrates the electrical connection between the RDL 133 and the conductive structure in the BEOL 128 of the IC structure 104. As shown in FIG. 1B, a conductive via 150 extends through the SiN layer 132, the BOX layer 120, the active semiconductor layer 122 and the remainder of the FEOL to connect to a conductive pad in the conductive layer M1. In this manner, electrical signals from the solder bump 146 (see FIG. 1A) can be routed into the conductive structures of the BEOL 118, 128 and the active semiconductor device in the active semiconductor layers 112, 122.

Figure 2A:
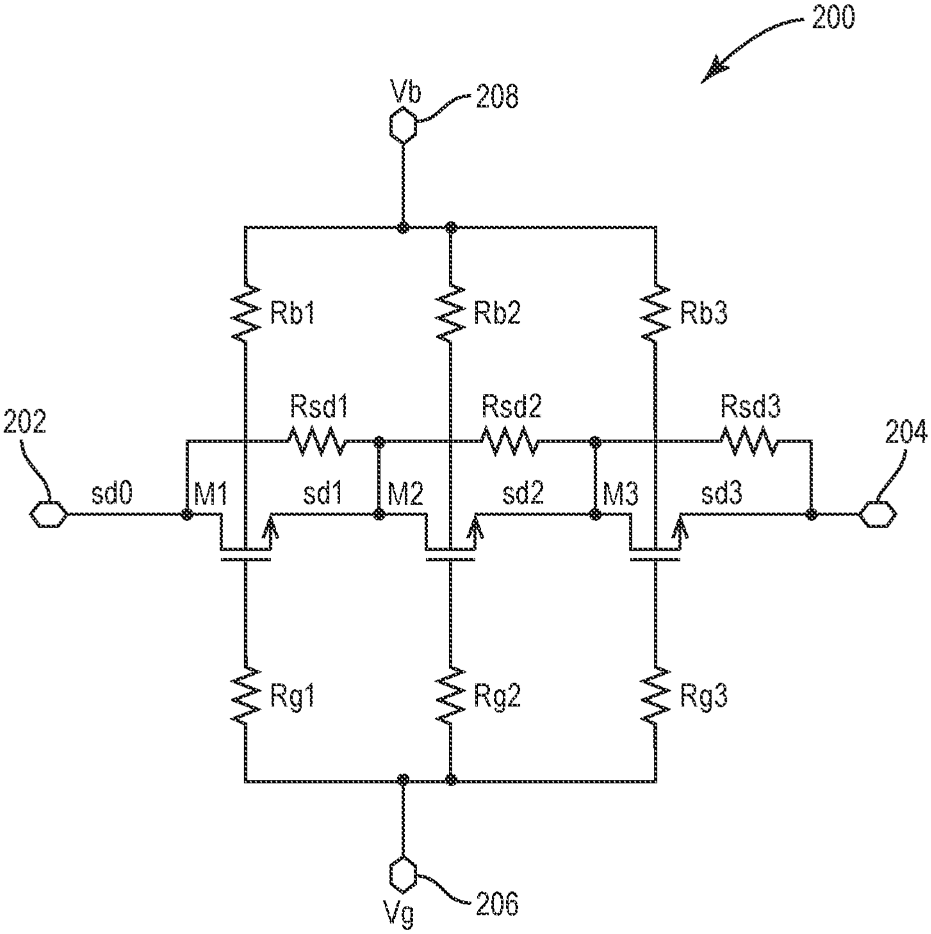
FIG. 2A is an IC circuit, in accordance with some embodiments.

FIG. 2A is an IC circuit 200, in accordance with some embodiments.

The IC circuit 200 is formed by the IC device 100 shown in FIG. 1A and FIG. 1B, in accordance with some embodiments. The IC circuit 200 is an IC switch. In FIG. 2A, the IC circuit 200 includes a FET M1, a FET M2, and a FET M3. In this embodiment, the IC circuit 200 forms a switch branch with three FETs M1, M2, M3. In other embodiments, the IC circuit 200 includes less than 3 FETs. In other embodiments, the IC circuit 200 includes more than 3 FETs. In some embodiments, the IC circuit 200 includes between 1 and 50 FETs. The FETs M1, M2, M3 are connected in series between a radio frequency (RF) input terminal 202 and an RF output terminal 204. As such, the drain of the FET M1 is connected to the RF input terminal 202 and the source of the FET M1 is connected to (or is integrated into) the drain of the FET M2. Metal trace sd0 connects the drain of the FET M1 to the RF input terminal 202 and metal trace sd1 connects the source of the FET M1 to the drain of the FET M2.

In FIG. 2A, a conductive trace sd0 connects the drain of the FET M1 to the RF input terminal 202. A conductive trace sd1 connects the source of the FET M1 to the drain of the FET M2. A conductive trace sd2 connects the source of the FET M2 to the drain of the FET M3. The conductive trace sd3 connects the drain of the FET M3 to the RF output terminal 204.

A resistor Rsd1 is connected from the trace sd0 to the trace sd1. Accordingly, the resistor Rsd1 is connected from the drain of the FET M1 to the drain of the FET M2. A resistor Rsd2 is connected from the trace sd2 to the trace sd1. Accordingly, the resistor Rsd2 is connected from the drain of the FET M2 to the drain of the FET M3. A resistor Rsd3 is connected from the trace sd2 to the trace sd3. Accordingly, the resistor Rsd3 is connected from the drain of the FET M3 to the source of the FET M3. In some embodiments, each of the resistors, Rsd1, Rsd2, Rsd3 each have a resistance of 10 KOhm.

A resistor Rg1 is connected between a gate voltage terminal 206 and a gate of the FET M1. A resistor Rg2 is connected between the gate voltage terminal 206 and a gate of the FET M2. A resistor Rg3 is connected between the gate voltage terminal 206 and a gate of the FET M3. In some embodiments, each of the resistors, Rg1, Rg2, Rg3 each have a resistance of 10 KOhm. A voltage Vg is received at the gate voltage terminal 206. The voltage Vg is in a low voltage state (e.g., ground) to open the FETs, M1, M2, M3. The voltage Vg is in a high voltage state (e.g., VDD) to close the FETs, M1, M2, M3.

A resistor Rb1 is connected between a body voltage terminal 208 and a body of the FET M1. A resistor Rb2 is connected between the body voltage terminal 208 and a body of the FET M2. A resistor Rb3 is connected between the body voltage terminal 206 and a body of the FET M3. In some embodiments, each of the resistors, Rb1, Rb2, Rb3 each have a resistance of 10 KOhm. A voltage Vb is received at the body voltage terminal 208.

Figure 2B:
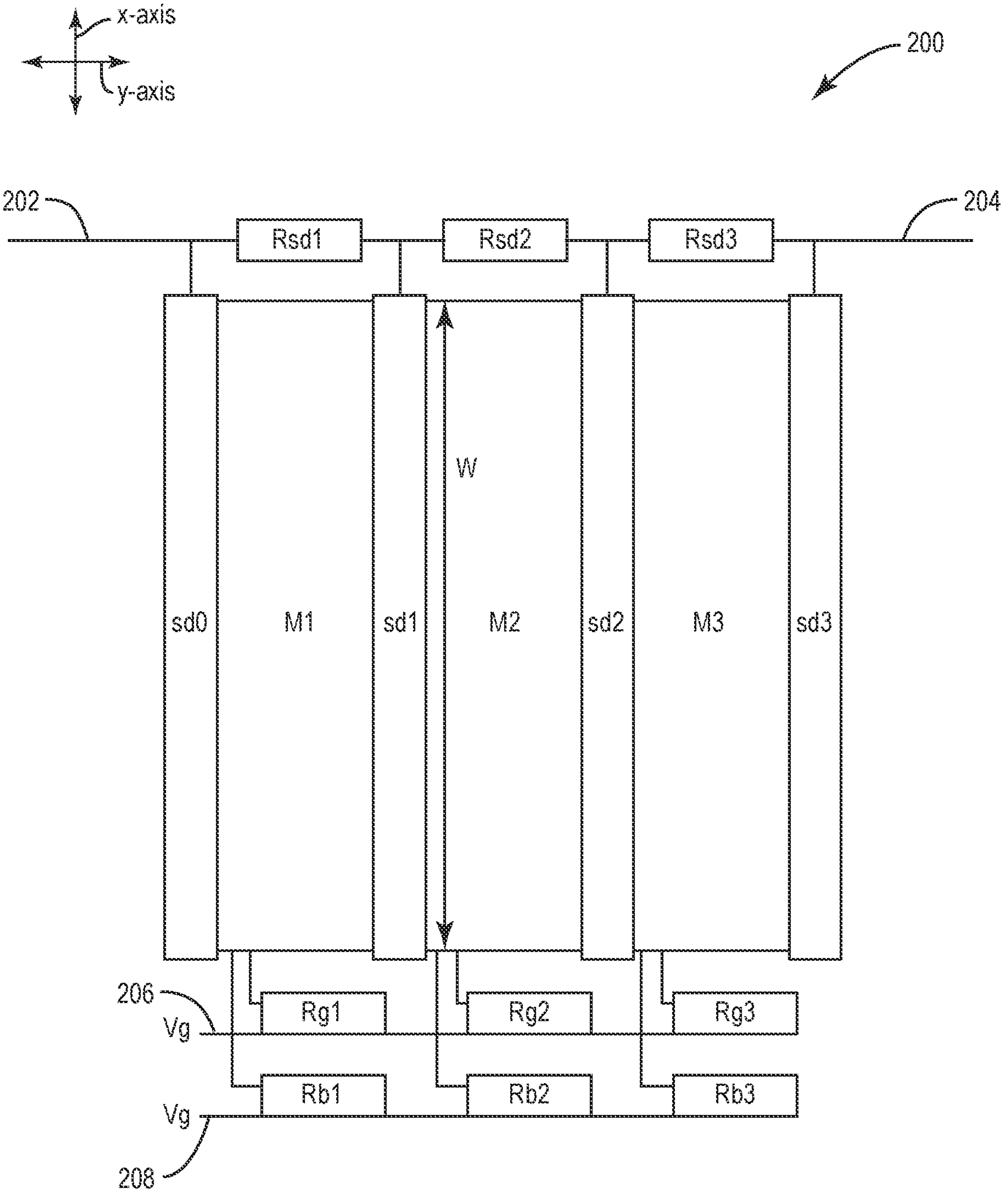
FIG. 2B is a generalized layout of the IC circuit shown in FIG. 2A, in accordance with some embodiments.

FIG. 2B is a generalized layout of the IC circuit 200 shown in FIG. 2A, in accordance with some embodiments.

Components that are the same between FIG. 2A and FIG. 2B are given identical element numbers. In some embodiments, the FET M1 is provided in the active semiconductor region 112 of FIG. 1. The FET M1 has a width W with respect to the x-axis. In some embodiments, one or more gates are provided so as to have a long axis extending with respect to the y-axis. The gates are between source/drain areas provided in the active semiconductor region 112 and in the active semiconductor region 122. In some embodiments, half of the width W of the FET M1 is provided in the active semiconductor region 112 and half of the width W of the FET M1 is provided in the active semiconductor region 122. In some embodiments, the conductive trace sd0 connects all of the source/drain areas so that they operate as the source/drain areas of a single FET M1. In some embodiments, the conductive trace sd0 is provided in the BEOL 118. In some embodiments, the resistor Rds1, the resistor Rg1, and the resistor Rb1 are each provided in the BEOL 118.

The FET M2 has a width W with respect to the x-axis. In some embodiments, one or more gates are provided so as to have a long axis extending with respect to the y-axis. The gates are between source/drain areas provided in the active semiconductor region 112 and in the active semiconductor region 122. In some embodiments, half of the width W of the FET M2 is provided in the active semiconductor region 112 and half of the width W of the FET M2 is provided in the active semiconductor region 122. In some embodiments, the conductive trace sd1 connects all of the source/drain areas so that they operate as the source/drain areas of a single FET M2. In some embodiments, the conductive trace sd1 is provided in the BEOL 118 and in the BEOL 128. In some embodiments, the conductive trace sd2 is provided in the BEOL 118 and in the BEOL 128. In some embodiments, the resistor Rds2, the resistor Rg2, and the resistor Rb2 are each provided in the BEOL 118.

The FET M3 has a width W with respect to the x-axis. In some embodiments, one or more gates are provided so as to have a long axis extending with respect to the y-axis. The gates are between source/drain areas provided in the active semiconductor region 122. The gates are between source/drain areas provided in the active semiconductor region 112 and in the active semiconductor region 122. In some embodiments, half of the width W of the FET M3 is provided in the active semiconductor region 112 and half of the width W of the FET M3 is provided in the active semiconductor region 122. In some embodiments, the conductive trace sd3 is provided in the BEOL 128. In some embodiments, the resistor Rds3, the resistor Rg3, and the resistor Rb3 are each provided in the BEOL 118.

Accordingly, the IC device 100 in FIG. 1A and FIG. 1B allows for the IC circuit 200 to be spread through two IC structures 102, 104 that are stacked on top of one another. This reduces the footprint of the circuit while not having a significant increase in height. As circuits become more compact so that solder bumps are provided over active semiconductor regions, the passivation layer 138 reduces the parasitic capacitance and allows the IC circuit 200 to operate appropriately.

Figure 3:
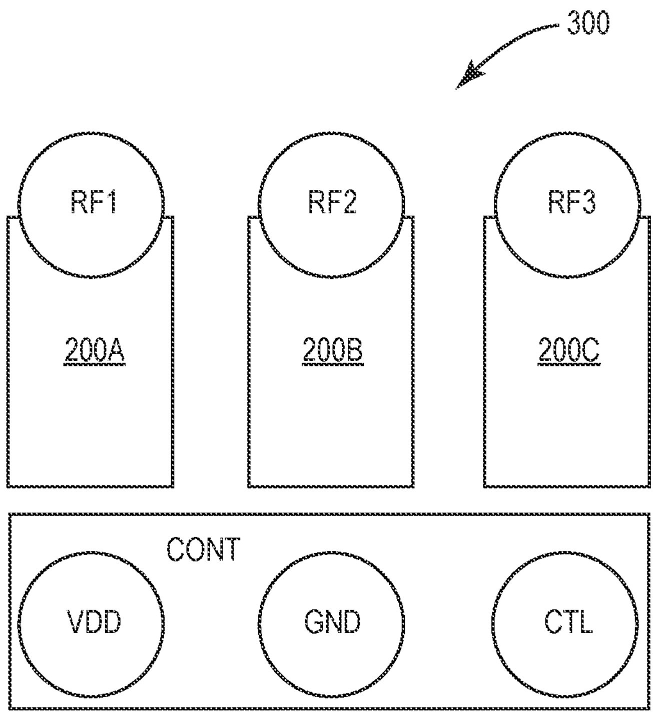
FIG. 3 is an IC device, in accordance with some embodiments.

FIG. 3 is an IC device 300, in accordance with some embodiments.

In some embodiments, the IC device 300 includes the IC circuits 200A, 200B, 200C. Each of the IC circuits 200A, 200B, 200C is provided as the IC circuit 200 described above with respect to FIG. 2A-2B. Thus, each of the IC circuits 200A, 200B, 200C is a different switch branch. The solder ball RF1 is connected to the terminal 202 (See FIG. 2A) of the IC circuit 200A and the terminal 204 (See FIG. 2A) of the IC circuit 200A is connected to ground GND. The solder ball RF2 is connected to the terminal 202 (See FIG. 2A) of the IC circuit 200B and the terminal 204 (See FIG. 2A) of the IC circuit 200B is connected to ground GND. The solder ball RF3 is connected to the terminal 202 (See FIG. 2A) of the IC circuit 200C and the terminal 204 (See FIG. 2A) of the IC circuit 200C is connected to ground GND. Solder balls RF1, RF2, RF3 are provided so as to cover 20% of the areas with the IC circuit 200A, 200B, 200C.

Figure 4:
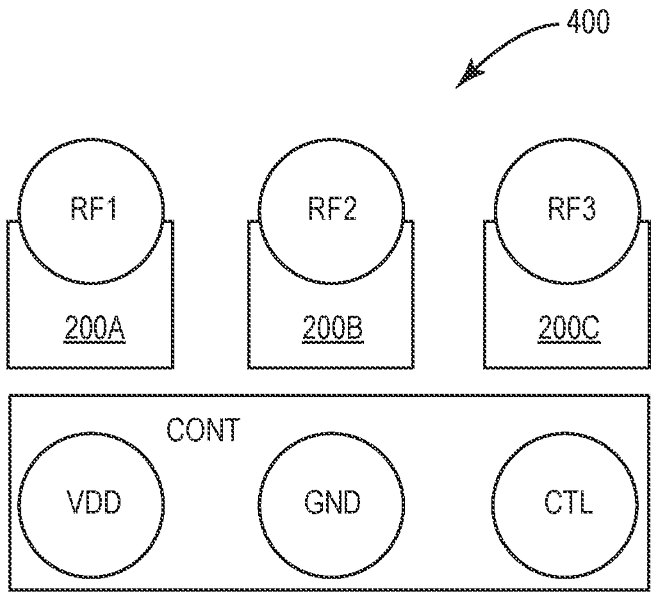
FIG. 4 is an IC device, in accordance with some embodiments.

FIG. 4 is an IC device 400, in accordance with some embodiments.

In some embodiments, the IC device 400 includes the IC circuit 200A, 200B, 200C described above with respect to FIG. 3. Solder balls RF1, RF2, RF3 are provided so as to cover 50% of the areas with the IC circuit 200A, 200B, 200C. The IC circuit 400 in FIG. 4 has a smaller footprint than the IC device 300 in FIG. 3.

Figure 5:
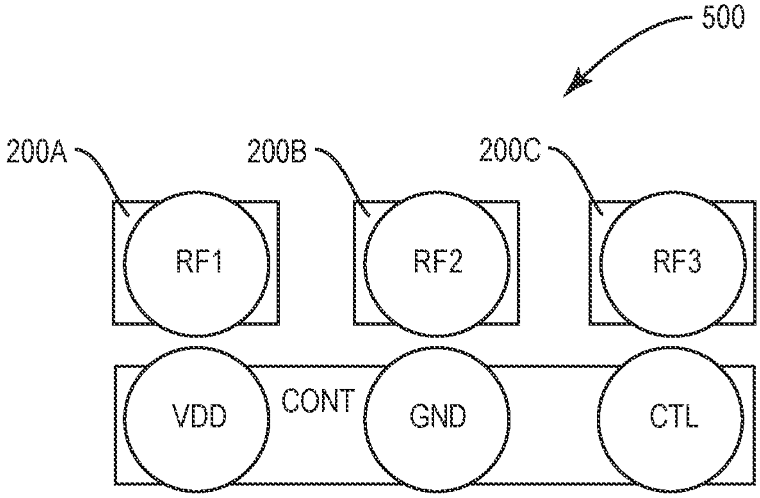
FIG. 5 is an IC device, in accordance with some embodiments.

FIG. 5 is an IC device 500, in accordance with some embodiments.

In some embodiments, the IC device 500 includes the IC circuit 200A, 200B, 200C described above with respect to FIG. 3. Solder balls RF1, RF2, RF3 are provided so as to cover 100% of the areas with the IC circuit 200A, 200B, 200C described above with respect to FIG. 3. The IC circuit 500 in FIG. 5 has a smaller footprint than the IC circuit 400 in FIG. 4 and the IC circuit 300 in FIG. 3.

As shown by FIG. 3, FIG. 4, and FIG. 5, as the die size of the IC devices 300, 400, 500 becomes smaller, a greater portion of the solder bumps RF1, RF2, RF3, is placed over the switch branches formed by the IC circuits 200A, 200B, 200C. The configuration of the external connection structure 131 (See FIG. 1A) (with the two redistribution layers 133, 140 (See FIG. 1A) and the passivation layer 138 (See FIG. 1A) between the two redistribution layers 133, 140 (See FIG. 1A)) reduces the capacitive coupling between the solder balls RF1, RF2, RF3 and the switch branches formed by the IC circuits 200A, 200B, 200C. The reduction of the capacitive coupling enhances the performance of the switch branches formed by the IC circuits 200A, 200B, 200C. Thus, using the external connection structure 131 (See FIG. 1A) reduces performance degradation by increasing the isolation and the distance between the switch branches formed by the IC circuits 200A, 200B, 200C and the bottom of the solder bumps RF1, RF2, RF3.

FIG. 6A-6D illustrate different embodiments of a manufacturing process, in accordance with some embodiments.

Figure 6A:
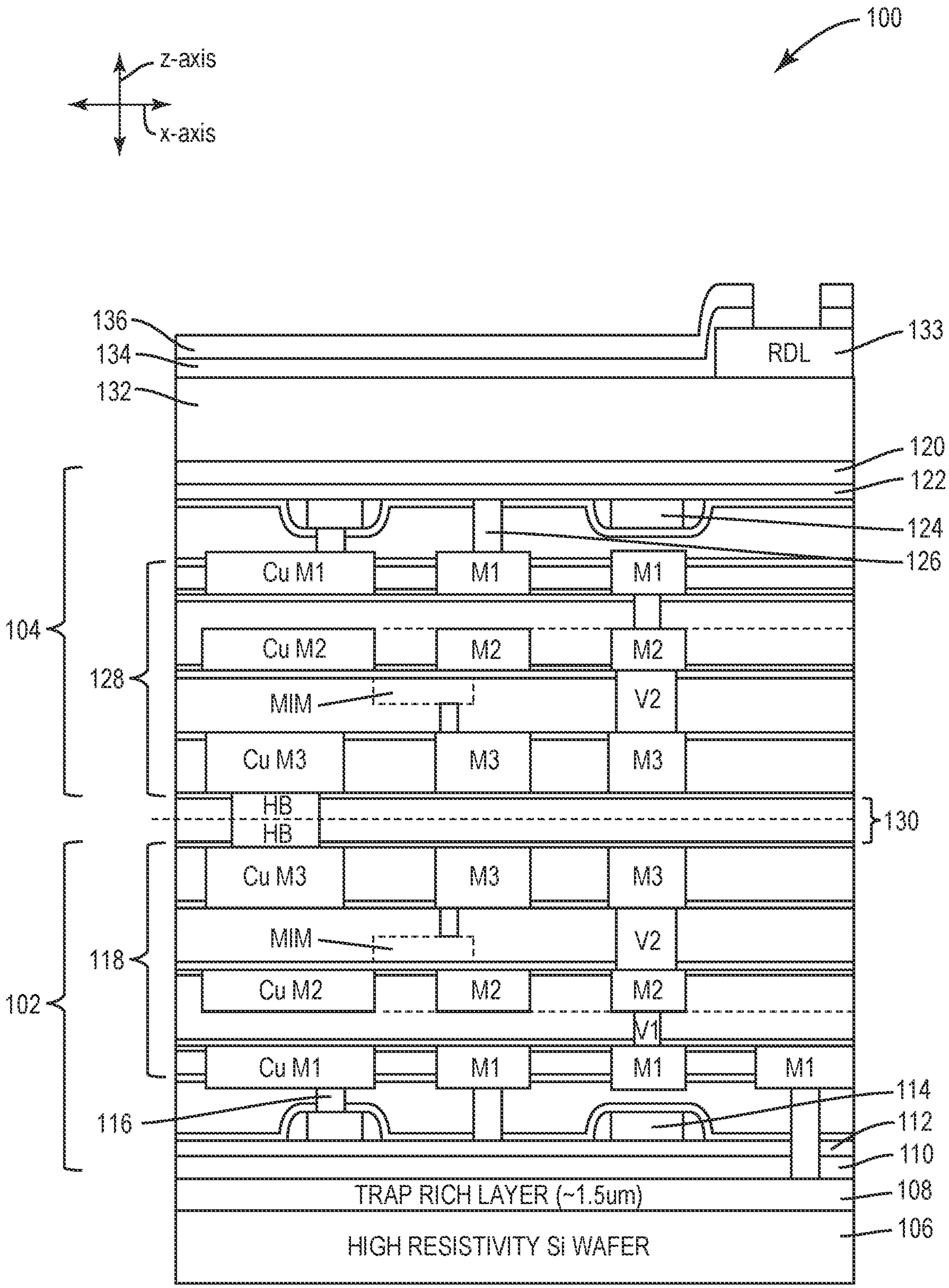
FIG. 6A-6D illustrate different embodiments of a manufacturing process, in accordance with some embodiments.

In FIG. 6A, the IC device 100 is provided. The IC device 100 includes the active semiconductor layer 112 that includes active semiconductor device regions, the BEOL 118 positioned on the active semiconductor layer 112. The IC device 100 also includes the conductive structure that is integrated into the BEOL 118 and connects to at least one of the active semiconductor device regions of the active semiconductor layer 112. The IC device 100 includes the active semiconductor layer 122 that includes active semiconductor device regions. The IC device 100 further includes the BEOL 128 positioned on the active semiconductor layer 122. The IC device 100 also includes a conductive structure integrated into the BEOL 128 and that connects to at least one of the active semiconductor device regions in the active semiconductor layer 122. In this example, the hybrid bonding layer 130 connects the conductive structure in the BEOL 118 with the conductive structure in the BEOL 128. At FIG. 6A, a redistribution layer 133 positioned over the second active conductor layer, the first redistribution layer is electrically connected to the second conductive structure of the BEOL 128. Flow then proceeds to FIG. 6B.

Figure 6B:
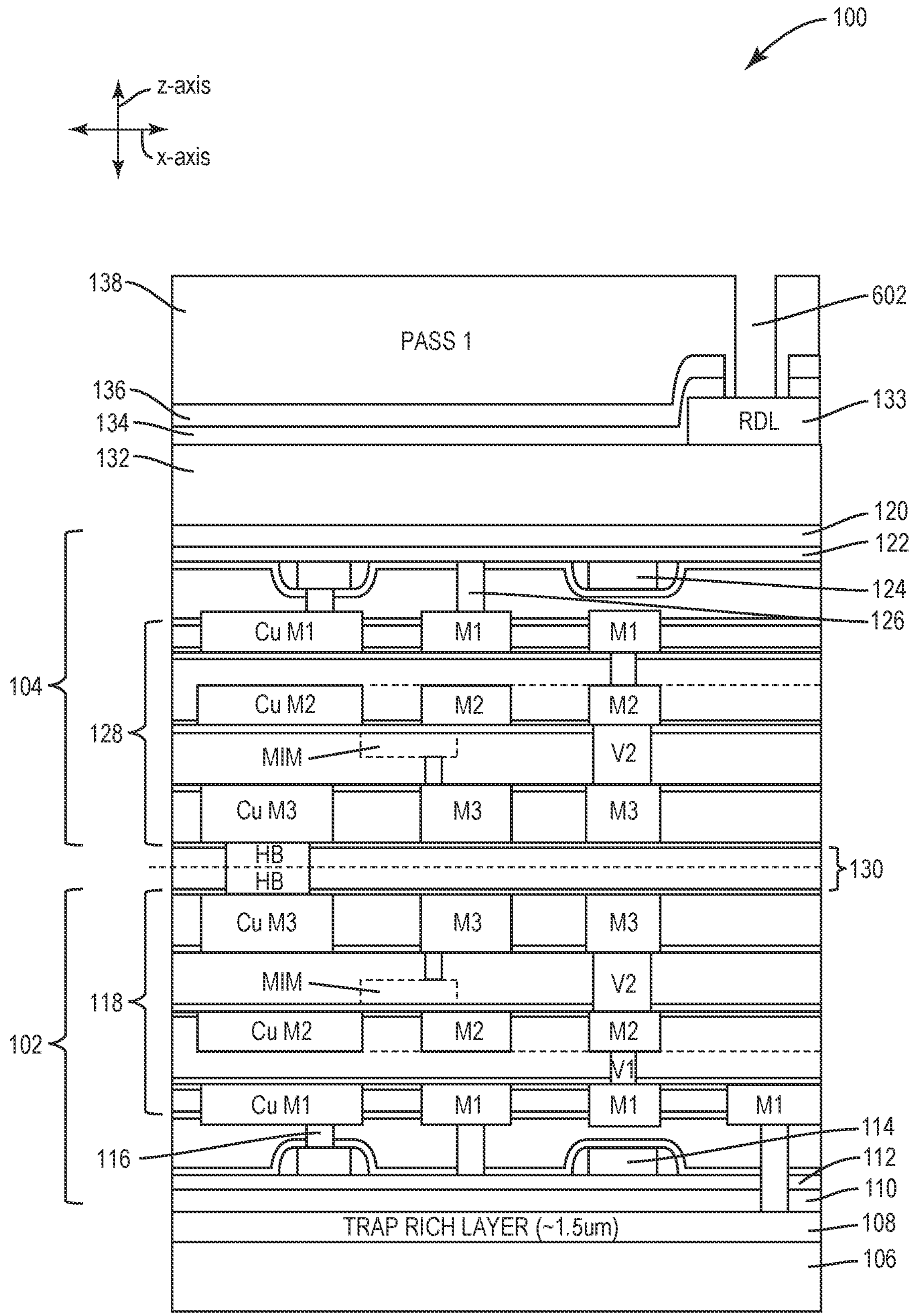

At FIG. 6B, forming the passivation layer 138 positioned on the redistribution layer 133. The passivation layer 138 ensures that there is sufficient isolation between the active semiconductor layer 122 and the solder bump 146 (See FIG. 1) that is to be formed over the active semiconductor layer 122. Accordingly, the passivation layer 138 lowers the parasitic capacitance. As shown, a passage 602 is etched into the passivation layer 142 to expose a portion of the redistribution layer 133. Flow then proceeds to FIG. 6C.

Figure 6C:
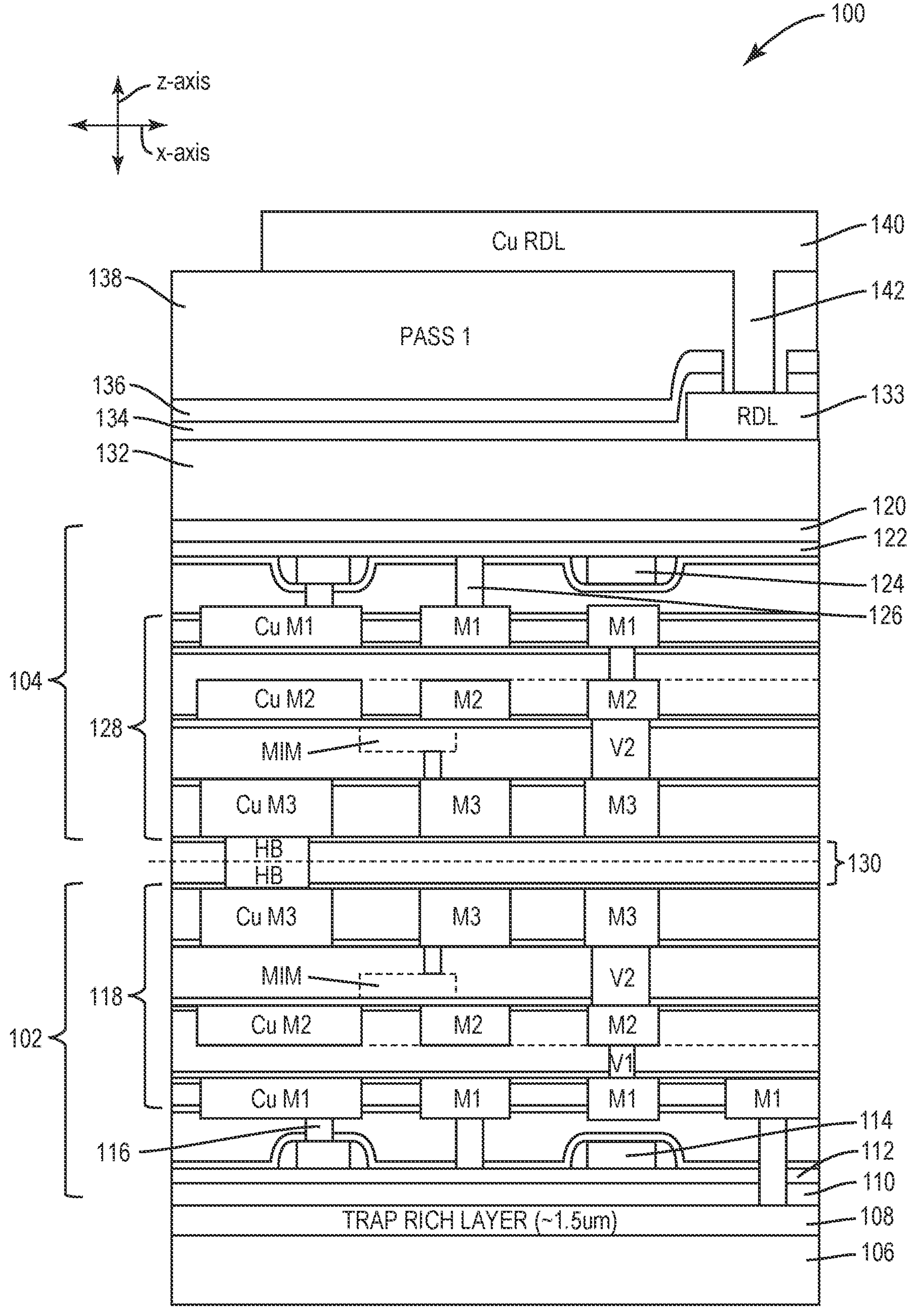

At FIG. 6C, the redistribution layer 140 is formed and positioned over the passivation layer 138. The redistribution layer 140 is electrically connected to the redistribution layer 133. In this embodiment, the passage 602 is filled with conductive material to form the conductive via 142 that electrically connects the redistribution layer 140 with the redistribution layer 138. Flow then proceeds to FIG. 6D.

Figure 6D:
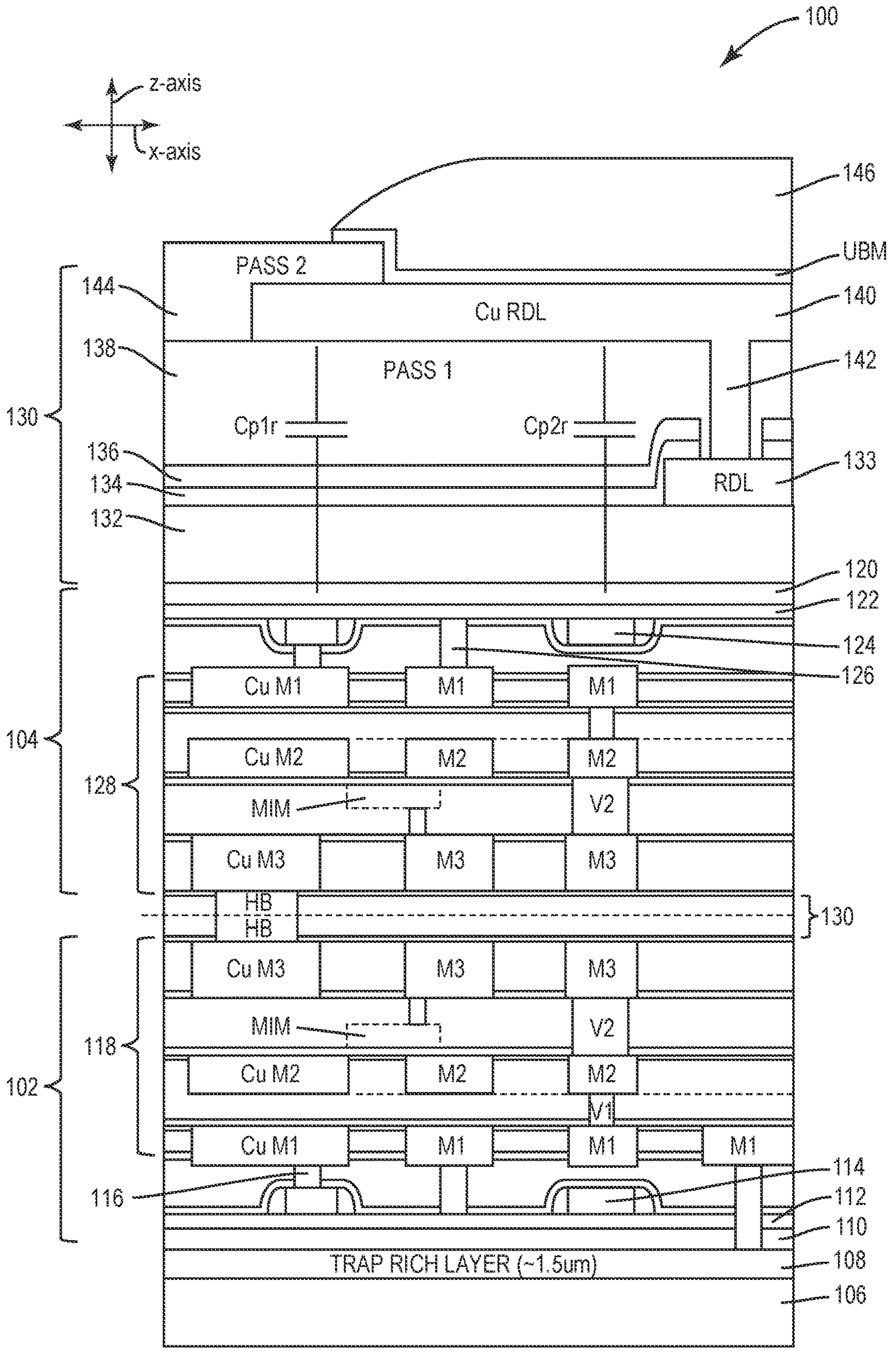

At FIG. 6D, the solder bump 146 is formed and positioned over the redistribution layer 140. In this manner, external signals received into and transmitted through the redistribution layer 138, the redistribution layer 140, and the solder bump 146.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. An integrated circuit (IC) device, comprising:
- a first buried oxide layer;
- a trap rich layer;
- a handle layer;
- a first active semiconductor layer that includes first active semiconductor device regions, wherein the first active semiconductor layer is positioned on the first buried oxide layer, the trap rich layer is positioned on the first buried box layer, and the handle layer is positioned on the first trap rich layer;
- a first back end of line (BEOL) positioned on the first active semiconductor layer;
- a first conductive structure is integrated into the first BEOL and connects to at least one of first active semiconductor components;
- a second active semiconductor layer that includes second active semiconductor components;
- a second BEOL positioned on the second active semiconductor layer, wherein a second conductive structure is integrated into the second BEOL and connects to at least one of the second active semiconductor components, wherein the second conductive structure is electrically connected to the first conductive structure;
- a first redistribution layer positioned over the second active semiconductor layer, the first redistribution layer is electrically connected to the second conductive structure;
- a passivation layer positioned on the first redistribution layer;
- a second redistribution layer positioned over the passivation layer, wherein the second redistribution layer is electrically connected to the first redistribution layer; and
- a hybrid bonding layer with a third conductive structure integrated into the hybrid bonding layer, wherein:
  - the first BEOL is positioned under the hybrid bonding layer;
  - the second BEOL is positioned on the hybrid bonding layer; and
  - the third conductive structure electrically connects the first conductive structure to the second conductive structure.

2. The IC device of claim 1, wherein a second handle layer is not provided in the IC device.

3. The IC device of claim 1, further comprising a second buried oxide layer and a silicon nitride layer or a silicon dioxide layer, wherein:
- the passivation layer is a first passivation layer;
- the second active semiconductor layer is positioned on the second buried oxide layer;
- the silicon nitride layer or the silicon dioxide layer is positioned on the second buried oxide layer.

4. The IC device of claim 3, further comprising a second passivation layer and a third passivation layer, wherein:
- the second passivation layer is positioned on the silicon nitride layer or the silicon dioxide layer;
- the third passivation layer is positioned on the second passivation layer;
- the first passivation layer is positioned on the third passivation layer.

5. The IC device of claim 4, further comprising a conductive via that extends through the first passivation layer, the second passivation layer, and the third passivation layer so that the conductive via connects the second redistribution layer to the first redistribution layer.

6. The IC device of claim 1, further comprising:
- a solder bump positioned on the second redistribution layer.

7. The IC device of claim 6, wherein the solder bump is at least partially aligned over the first active semiconductor layer and the second active semiconductor layer.

8. The IC device of claim 1, further comprising one or more first gate electrodes positioned over the first active semiconductor device regions such that the one or more first gate electrodes and the first active semiconductor device regions form one or more first field effect transistors (FETs).

9. The IC device of claim 8, further comprising one or more second gate electrodes positioned over the second active semiconductor device regions such that the one or more second gate electrodes and the second active semiconductor device regions form one or more second FETs.

10. The IC device of claim 9, wherein the one or more first FETS and the one or more second FETs are connected by the first conductive structure and the second conductive structure to provide a stack of FETs coupled in series.

11. The IC device of claim 1 further comprising a conductive via that connects the first redistribution layer to the second conductive structure.

12. The IC device of claim 1, wherein the first redistribution layer comprises aluminum.

13. The IC device of claim 12, wherein the second redistribution layer comprises copper.

14. An integrated circuit (IC) device, comprising:
- a buried oxide layer;
- a trap rich layer;
- a handle layer;
- a first active semiconductor layer that includes first active semiconductor device regions, wherein the first active semiconductor layer is positioned on the buried oxide layer, the trap rich layer is positioned on the buried box layer, and the handle layer is positioned on the trap rich layer;
- a second active semiconductor layer that includes active semiconductor regions, the second active semiconductor layer being connected to the first active semiconductor layer and being positioned over the first active semiconductor layer;

a first back end of line (BEOL) having a first conductive structure that is electrically connected to the first active semiconductor layer;

a second BEOL having a second conductive structure that is electrically connected to the second active semiconductor layer;

a hybrid bonding layer with a third conductive structure that electrically connects the first conductive structure to the second conductive structure, wherein:

the first BEOL is positioned under the hybrid bonding layer;

the first BEOL is positioned on the first active semiconductor layer;

the hybrid bonding layer is positioned between the first BEOL and the second BEOL;

the second BEOL is positioned between the hybrid bonding layer and the second active semiconductor layer;

a first redistribution layer positioned over the second active semiconductor layer, the first redistribution layer is electrically connected to the first active semiconductor layer and the second active semiconductor layer;

a passivation layer positioned on the first redistribution layer;

a second redistribution layer positioned over the passivation layer, wherein the second redistribution layer is electrically connected to the first redistribution layer.

15. The IC device of claim 14, wherein the first redistribution layer comprises aluminum.

16. The IC device of claim 15, wherein the second redistribution layer comprises copper.

17. A method of manufacturing an integrated circuit (IC), comprising:

providing an IC device that comprises:

a buried oxide layer;

a trap rich layer;

a handle layer;

a first active semiconductor layer that includes a first active semiconductor device regions, wherein the first active semiconductor layer is positioned on the buried oxide layer, the trap rich layer is positioned on the buried box layer, and the handle layer is positioned on the trap rich layer;

a first back end of line (BEOL) positioned on the first active semiconductor layer;

a first conductive structure is integrated into the first BEOL and connects to at least one of the first active semiconductor device regions;

a second active semiconductor layer that includes second active semiconductor device regions;

a second BEOL positioned on the second active semiconductor layer, wherein a second conductive structure is integrated into the second BEOL and connects to at least one of the second active semiconductor regions, wherein the second conductive structure is electrically connected to the first conductive structure; and a hybrid bonding layer with a third conductive structure integrated into the hybrid bonding layer, wherein:

the first BEOL is positioned under the hybrid bonding layer;

the second BEOL is positioned on the hybrid bonding layer; and the third conductive structure electrically connects the first conductive structure to the second conductive structure;

forming a first redistribution layer positioned over the second active semiconductor layer, the first redistribution layer is electrically connected to the second conductive structure;

forming a passivation layer positioned on the first redistribution layer;

forming a second redistribution layer positioned over the passivation layer, wherein the second redistribution layer is electrically connected to the first redistribution layer.

* * * * *